US007816985B2

(12) United States Patent
Attwood et al.

(10) Patent No.: US 7,816,985 B2
(45) Date of Patent: Oct. 19, 2010

(54) SWITCHING AMPLIFIERS

(75) Inventors: Brian E Attwood, Sinaloa (MX);
Wilson E. Taylor, Austin, TX (US);
Larry E. Hand, Meridian, MS (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/270,692

(22) Filed: Nov. 13, 2008

(65) Prior Publication Data
US 2009/0128237 A1 May 21, 2009

Related U.S. Application Data

(60) Provisional application No. 60/988,365, filed on Nov. 15, 2007.

(51) Int. Cl.
*H03F 3/217* (2006.01)
(52) U.S. Cl. ................ 330/251; 330/207 A; 330/10
(58) Field of Classification Search .............. 330/10, 330/207 A, 251
See application file for complete search history.

(56) References Cited

U.S. PATENT DOCUMENTS

| | | | |
|---|---|---|---|
| 4,178,556 A | 12/1979 | Attwood | |
| 4,554,512 A * | 11/1985 | Aiello | ........... 330/10 |
| 4,992,751 A | 2/1991 | Attwood et al. | |
| 6,198,263 B1 | 3/2001 | Chan | |
| 6,294,954 B1 | 9/2001 | Melanson | |
| 6,459,336 B1 | 10/2002 | Luu | |
| 7,034,609 B2 | 4/2006 | Risbo et al. | |
| 7,078,693 B2 | 7/2006 | Andersen et al. | |
| 7,138,864 B2 | 11/2006 | Mazda | |
| 7,279,697 B2 | 10/2007 | Quilter | |

(Continued)

FOREIGN PATENT DOCUMENTS

JP 7321567 12/1995

(Continued)

OTHER PUBLICATIONS

Leggate et al., "Pulse-Based Dead-Time Compensator for PWM Voltage Inverters," IEEE Transactions Industrial Electronics, vol. 44, Issue 2 (Apr. 1997), pp. 191-197.

(Continued)

*Primary Examiner*—Robert Pascal
*Assistant Examiner*—Hieu P Nguyen
(74) *Attorney, Agent, or Firm*—Fliesler Meyer LLP

(57) ABSTRACT

Systems and methods implemented in a switching amplifier for providing consistent, matching switching between top and bottom switching devices in a switching amplifier. One embodiment includes a half-bridge circuit output stage, a driver stage and a transformer. The driver stage, which drives the switches of the output stage, is very fast, has a low propagation delay, and has minimal input capacitance. The transformer drives the drive paths from the transformer inputs to the switches. The transformer avoids resonances within the audio band and at the amplifier switching frequencies, has low and spread free leakage inductance, has enough magnetizing inductance to keep transformer currents low in proportion to the total driver stage current drain, has low core losses at the switching frequency, has minimal inductance change and operates well below its saturation point. The amplifier stage provides a substantially constant amplitude drive signal to the output power switching devices.

26 Claims, 11 Drawing Sheets

U.S. PATENT DOCUMENTS

| | | |
|---|---|---|
| 7,362,354 B2 | 4/2008 | Kost |
| 2002/0125941 A1 | 9/2002 | Nguyen et al. |
| 2007/0182486 A1 | 8/2007 | Chieng et al. |
| 2008/0116971 A1* | 5/2008 | McMorrow ................. 330/251 |

FOREIGN PATENT DOCUMENTS

| | | |
|---|---|---|
| JP | 2004-228912 | 8/2004 |
| JP | 2004-328413 | 11/2004 |

OTHER PUBLICATIONS

Written Opinion and International Search Report for PCT/US2008/083677 (Jul. 9, 2009).

* cited by examiner

SWITCHING AMPLIFIERS

PRIORITY CLAIM

This application claims priority under 35 U.S.C. 119(e) to U.S. Provisional Patent Application No. 60/988,365, filed Nov. 15, 2007, which is incorporated herein by reference.

BRIEF DESCRIPTION OF THE DRAWINGS

Other objects and advantages of the invention may become apparent upon reading the following detailed description and upon reference to the accompanying drawings.

Figure 1:
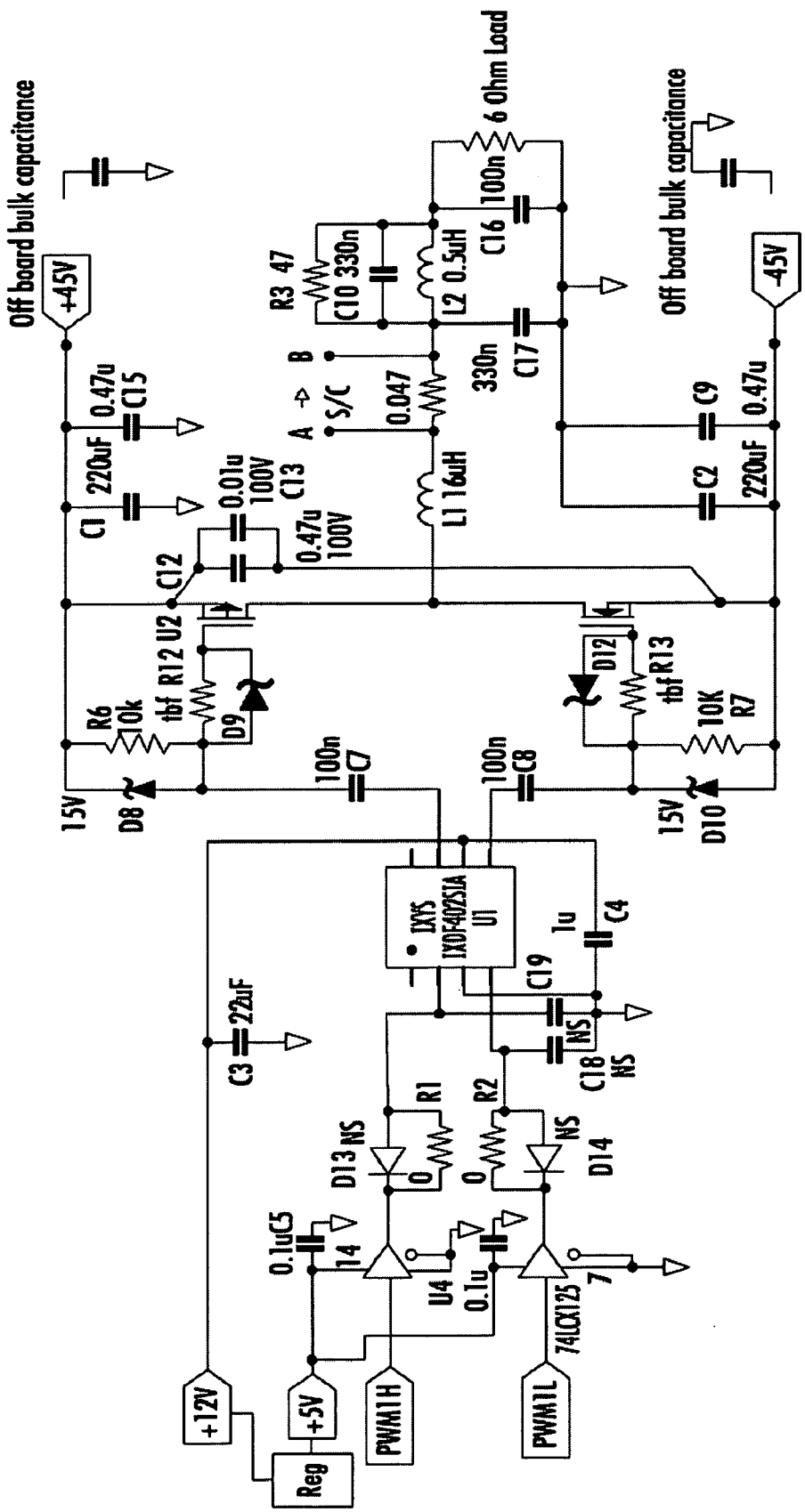
FIG. 1 is an example of a prior art circuit using basic P-channel/N-channel (Pch/Nch) combination.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION

A switching amplifier typically includes a pair of switching output devices (e.g., MOSFETs) that are turned on and off by drivers. It is important that such switching output devices not be on, or in conduction, at the same time, as high current will flow between voltage supply rails and through the switching output devices, causing a lack of efficiency, and potentially destruction of the devices. A dead time, which is a time when neither switching output device is turned on, is used to guarantee this does not occur. However, such dead time, if too long, can result in high total harmonic distortion plus noise (THD+N) and low efficiency. Embodiment of the present invention generally relate to audio amplification systems and more particularly to systems and methods for reducing and preferably minimizing distortion and noise resulting from such dead time.

An embodiment of the present invention provides a method whereby the output switching semiconductors (switches) have a reliable and safe drive method to achieve minimal dead time switching between top and bottom devices, particularly where same-polarity output devices are used. This allows a lowest possible THD+N to be reliably achieved without the potential of output device failures due to excessive shoot through currents between the supply rails and the devices, due to mismatched propagation delay spreads.

In accordance with an embodiment, to achieve low open loop distortion characteristics, especially in the mid-power range, dead time between top and bottom switches should be controlled to 2 ns or less. Also, these short dead times should be basically spread-free, since if the dead time approaches zero, or even worse goes negative, then catastrophic shoot through currents can occur, potentially destroying the output devices. Also, quiescent current in the system will progressively rise as the dead time approaches zero.

For all Nchannel (Nch) MOSFET topologies in particular, present IC-based drive systems often have inherent dead time spreads in the range +/−7 ns to +/−10 nS, these can give rise to excessive distortion products unless negative feedback is available. By way of example, at −12 dB FS, a dead time of 10 ns will typically produce 0.2% THD. A dead time of 5 ns will typically reduce this to 0.05% THD. At the other extreme, a 20 ns dead time for example, THD will rise to around 0.6-0.8%. For analog PWM (pulse width modulation), where feedback can be more easily implemented, the increased dead times can be accepted, but for totally digital systems, it is much more problematic due to the difficulty of applying local and global feedback.

Specific embodiments of the present invention provide a simple, low-cost switching amplifier with minimal component count—one that is capable of outstanding THD+N performance for both analog PWM and totally digital systems, particularly open loop (no feedback) topologies. Even for systems that can use feedback, it is much better to have very low open loop THD+N FIGS., since then only the minimum of feedback need be applied—just sufficient to lower the output impedance and reduce susceptibility to load changes on the low pass filter section, plus avoiding the higher order harmonic artifacts. Further, tight control on timing spreads will reduce large variations in amplifier quiescent currents.

Specific embodiments of the present system can reduce switching dead times between the output switches in a switching amplifier to within 2 ns (or less) of each other, in a stable and repeatable manner, thereby allowing improved and preferably optimal THD+N performance combined with safe operation. This will provide a major performance improvement over present topologies.

Some of the criteria used in a switching amplifier to produce extremely high performance have been fully discussed in an Audio Engineering Society paper by Brian E. Attwood entitled 'Design Parameters Important for Optimization of Very High Fidelity PWM (Class D) Audio Amplifiers' (Journal of the Audio Engineering Society, November 1983). One of the more important criteria is the need for precise timing between top and bottom output switches. Ideally, each output device should switch within 2 ns or less. Otherwise, a drastic increase in distortion (THD) will occur. This can give rise to distortion products that are 5 or 10 times worse than that achieved with an optimized minimal timing. Further, the resulting artifacts, particularly at the zero crossing point of the analog waveform, are of a higher order and can be audibly objectionable.

Another problem is that timing spreads in the drive waveforms to the output devices could be in such a direction that both output devices could be momentarily conducting at the same time during switching transitions. In this instance, very high destructive currents can flow from the supply rails through the semiconductor devices, potentially causing failure. One solution to this was discussed in the above mentioned Attwood paper, but this solution needs additional inductors and diodes and consequently is not an optimal solution. It will add cost and will still be subject to timing spreads, thus giving variable results on THD, but it does mitigate the failure mechanism.

It would be useful to overcome the aforementioned problems, and to reduce mismatch spread errors to less than 1 ns, and to provide safe operation coupled with very good THD characteristics.

Before discussing the circuit implementations of embodiments of the present invention in detail, there is some more background to the invention that will be found useful to consider. From a circuit point of view, at higher audio power output levels (typically above 150 W), same-polarity output devices will typically give the best results. For the rest of the disclosure, the semiconductor switching devices will be assumed to be MOSFETs, but the general principles will apply to other devices, for instance IGBT's, but not limited thereto.

Considering MOSFET devices, an all-Nch circuit topology would be the preferred solution rather than, for example, a hybrid Pch/Nch combination. This is because Pch (P-channel) devices that operate above 100 V are not readily available with good switching characteristics. Pch devices have much higher input capacitances (Ciss, Crs) and thus a higher gate charge (Qgs) than their Nch counterparts, plus body drain diode reverse recovery times (Trr), are considerably longer for Pch devices. Additionally, the "on" resistance (Rds'on') for a Pch device is much larger than for a Nch device having a similar die area. This means that any Nch/Pch output stage would tend to be inherently mismatched, which is not good for optimal circuit performance.

Up to 60 V or 100 V, however, a few Pch can be obtained that do have excellent performance and can be well matched to their complementary Nch part. A typical example would be Vishay Si7415DN Pch, which is totally complementary to the Si7414DN Nch, both of which are available from Vishay International, Inc., of Malvern, Pa., USA. Use of these devices allows very good circuit performance characteristics in terms of THD, and is the basis of many of D2Audio reference designs. However, as discussed earlier, the power output will have limitations due to the lower voltage ratings.

For this reason, the trend in topologies above 100 W to 150 W is to use all Nch devices. These devices can have excellent characteristics, very low gate charge (Qg), very fast internal body drain diodes, and voltages up to 250 V, while still retaining these good characteristics. Also, these devices in the circuit will be matched for both top and bottom devices. In some cases, devices are available that use adjacent dies from the same foundry wafer, and are in the same package, for instance a 5 pin TO220 package, such as the IRF4019H, IRF4020H series, available from International Rectifier, headquartered in El Segundo, Calif., USA. These devices give the very good semiconductor matching for the output devices, and thus can be used in the circuit topologies discussed below. But (as in all topologies) accurate timing is still needed on the gate drive signals, which is a topic discussed below.

Nch devices, while being the part of choice at higher power levels, do have one circuit application problem, however. The top Nch device preferably has a floating gate drive that will go above the main positive supply rail by an amount sufficient to enhance the device fully. For instance, this would likely be in the range +10 V to +15 V between gate and source. In the case of split rail +/−supplies, the lower device drive can be referenced to the −ve rail, which is effectively an ac ground. Consequently, Nch devices are easier to drive, but timing relationships between upper and lower devices still should be within 2 ns or less for best performance.

There are several solutions to the high side drive problem which are known to those skilled in the art, and which are in use today, but they do not achieve the tight tolerances desired for consistent THD+N performance, coupled with safety from shoot through conduction due to the spreads in the circuit topology. This is particularly true in the case of the most common solution, which uses dedicated IC drivers for both high and low side devices from the same package.

These high voltage IC's, however, have a basic problem, in that due to the internal voltage level shifting needed for the high side drive in particular, they have quite long propagation delays, often in the region of 80 to 100 ns. While propagation delay in itself is not a major problem, the fact that it is long means that spreads in this delay are inevitable. Most devices indicate that matching between top and bottom devices is unlikely to be better than +/−7 ns, and is typically +/−10 ns.

To avoid destructive shoot through currents due to cross conduction between the upper and lower output devices, these circuit topologies should have a circuit dead time in the region of at least 7 ns to 10 ns. An exception to this would be the possibility of digital signal processor (DSP) controlled systems, which could sense the onset of shoot through currents and correct dead time accordingly.

As mentioned earlier, large dead times will give rise to high THD (see Attwood paper), which are not ideally suited to very high fidelity amplifiers. Most applications using these IC's thus require negative feedback. Consequently, this is more often an analog type PWM circuit where it is easier to apply feedback. Fully digital implementations that are open loop will thus typically suffer from relatively high THD.

There are some fully digital circuit implementations now becoming available, e.g., from D2Audio Corporation of Austin, Tex., USA, which is a division of Intersil Corporation of Milpitas, Calif., USA. But even these implementations need for very precise, consistent timing. This is especially true at the higher audio frequencies where feedback is falling off rapidly. Accordingly, an open loop system optimized for very high performance would be extremely beneficial.

The fact that there is still currently a problem in the present art to achieve the stringent criteria discussed in this application can be appreciated from U.S. Pat. No. 7,034,609, assigned to Texas Instruments, which details the problem independently. The solution offered in the '609 patent is different to the solution provided by embodiments of the present invention, but the background provided in the '609 patent provides some additional reading as to the problems in stability of dead times and performance.

In view of the foregoing, it can be seen that it would be desirable to provide a technique which will consistently give improved and preferably optimized timing characteristics coupled with good circuit reliability.

Exemplary embodiments of the present invention will now be summarized and also discussed in relation to detailed, specific embodiments and diagrams.

According to the present invention, a circuit topology is developed that seeks to provide consistent matching between top and bottom device switching, typically to 1 ns or less, with the median set at 2 ns.

This is possible due to the very short circuit propagation delays which are inherent in the circuit topologies of embodiments of the present invention, in the region of 6 ns to 10 ns, (rather than the typical IC driver delays of 70 ns to 100 ns discussed earlier). Advantageously, they are controlled very precisely, such that any resulting mismatch spreads occurring in the topologies given in this disclosure will be proportionately reduced, to typically provide 1 ns matching to the aforesaid output devices.

There are various circuit implementations which will be discussed in the detailed description of embodiments below.

The basic system uses a specially designed transformer drive, capable of 0 to 100% duty cycle, but which in practice is limited to 3% to 97%. The transformer drive is followed by carefully selected identical active circuits for both top and bottom MOSFET gate drive paths. These have minimal propagation delays, (by way of example, 6 ns to 7 ns) which are also very precise and well matched. The total system then produces the 1 ns typical matching. The design of the transformer, surrounding components, and following drive circuit are all important to the overall success of the circuit topology.

For the audio application under consideration, many conflicting requirements need to be met that are totally different from conventional transformer drives, for power supplies and the like. The wide duty cycle variations mean that, to avoid substantial changes in drive amplitude (as a result of volt/second balancing in the transformer), DC restoration of the secondary waveforms is needed. This is well known in the prior art.

However, in the audio applications under discussion, further criteria become unique to the transformer and surrounding components which are quite different from conventional topologies for power supplies and the like. These important differences are as follows.

The isolation transformer should handle not only the fundamental switching frequency of the system, typically in the range from 200 KHz to 500 KHz, but also the audio PWM modulated range spectrum from at least 20 Hz to 20 kHz, or even 40 kHz for super audio compact disc (SACD) systems and the like.

Thus, the transformer has to maintain complete signal transfer integrity over a very wide band of frequencies, maintain constant amplitude output, and not have any significant resonances due to the external circuit capacitances coupled to the transformer (which would influence the low pass filtered audio integrity). Such resonances should not occur within the audio bandwidths or even at close harmonics of the audio, and of course not at the switching frequency.

The transformer should also have sufficient inductance to keep magnetizing currents low, coupled with low RF losses. Leakage inductance is also important since any leakage inductance will effectively introduce a propagation delay, so this needs to be minimized. Further, this leakage inductance should be as spread-free as possible. Otherwise, in the case where two separate transformer configurations are used, mismatch of drives can occur. Where one transformer is used, the leakage inductance will track on both upper and lower output devices, but then care has to be taken that no turn on/off pops are transmitted to the loudspeaker.

It can be seen that, for such a system to work correctly, special design techniques which are quite different from the prior art are required for the total circuit implementation. These will be discussed in more detail below. It should be noted that the embodiments described below are exemplary and are intended to be illustrative of the invention rather than limiting.

FIG. 1 shows a prior art system using Pch and Nch MOSFET devices. This type of circuit is very easy to drive, since the gate drive signals are effectively at AC ground. The Pch device is referenced to the positive supply and the Nch device is referenced to the negative supply rail. Propagation delays can be minimized, since the gate signals are sourced via capacitors from the ground-referenced driver IC, and then DC restored via diodes D8 and D10.

Circuits using this technique are best applied at lower powers up to 100 W or 150 W, where optimized and matched Pch and Nch pairs are still available (Vishay 60V Si7414 and Si7415, for example). These devices have very well matched low gate charge (Qg), on resistance (Rds 'on'), and body drain diode reverse recovery (Trr) times.

The usefulness of this circuit topology diminishes at higher powers, since higher supply voltages are needed, and above 100 V, matched Pch and Nch devices are not readily available. Unmatched devices will usually give higher THD+N values and, due to the slower speed, Pch devices above 100 V or so will result in higher circuit losses. For this reason, all Nch devices are to be preferred above 100 V. However, as mentioned earlier in this application, all-Nch circuits are more difficult to drive due to the floating high side gate driver requirement.

Figure 2:
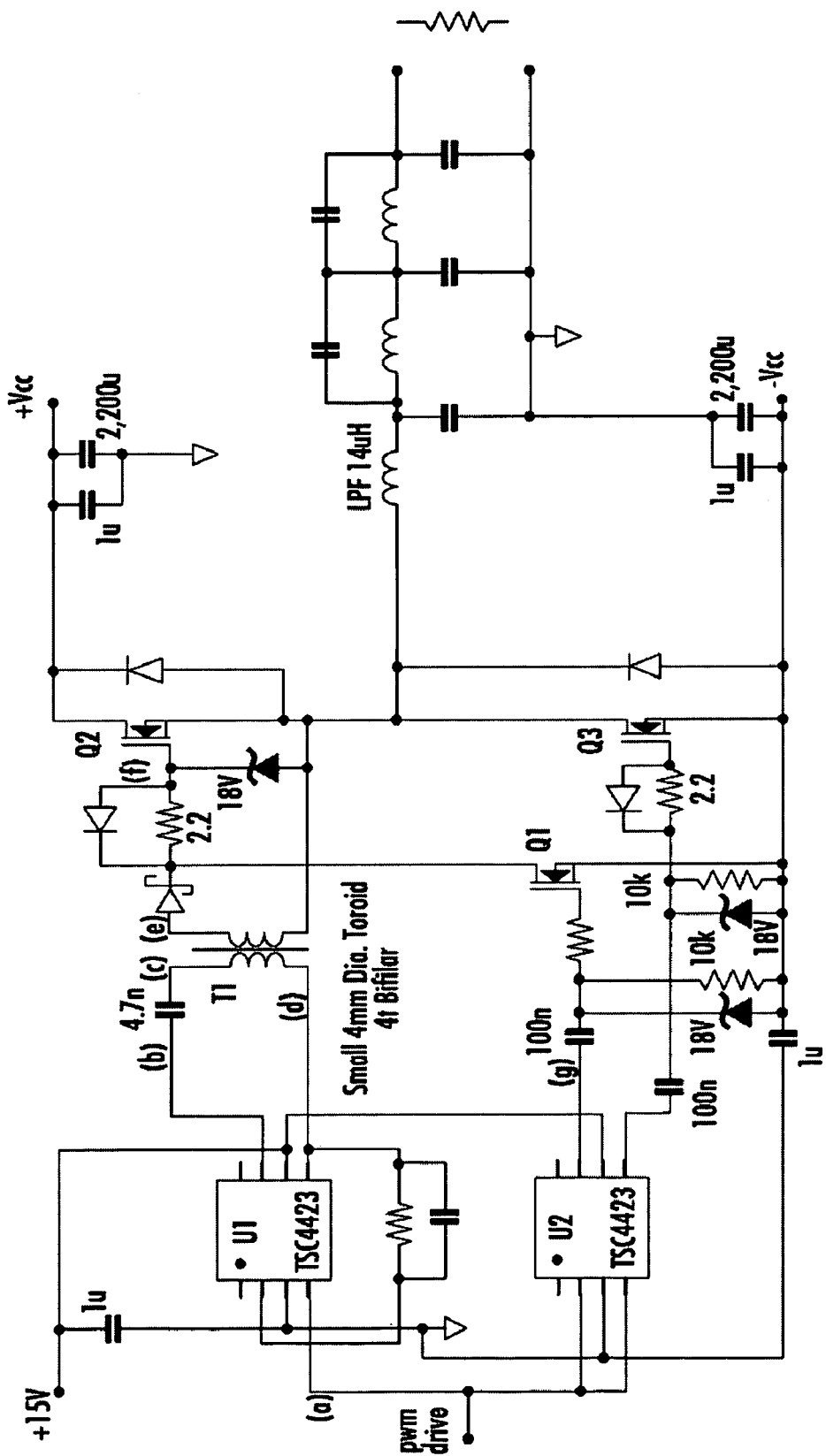
FIGS. 2, 3 and 4 are examples of prior art circuits using various all N-channel (Nch) topologies.

FIG. 2 shows one prior art solution that provides the required level-shifted, top-gate drive signal by applying the ground-referenced signal to a small bead or toroid pulse transformer. This transformer is designed to saturate after the leading front edge has been applied. Thus, the voltage on the secondary of the transformer collapses and the secondary diode becomes back-biased, leaving the charge on the MOSFET due to its input gate capacitance (Ciss). When the drive signal is required to go negative, Q1 will be activated and turned 'on' to discharge the gate charge on Q2. This circuit is effective, but has small spreads in both timing and Vgs drive amplitude.

Timing spreads can typically be kept to less than 5 ns, and either adjusted in a DSP (not shown) or at the input to the drivers U1 and U2. These timing variations are due to small spreads in the transformer saturation point, which will also be temperature dependent, plus spreads on the leakage inductance. Also switching time spreads in turn off switch Q1.

Small Vgs amplitude spreads over the duty cycle are due to the Ciss charge slowly decaying on the MOSFET gate after the initial pulse on the rising edge. This in general will only be a few percent, but slightly increases the THD+N at higher power levels.

Figure 3:
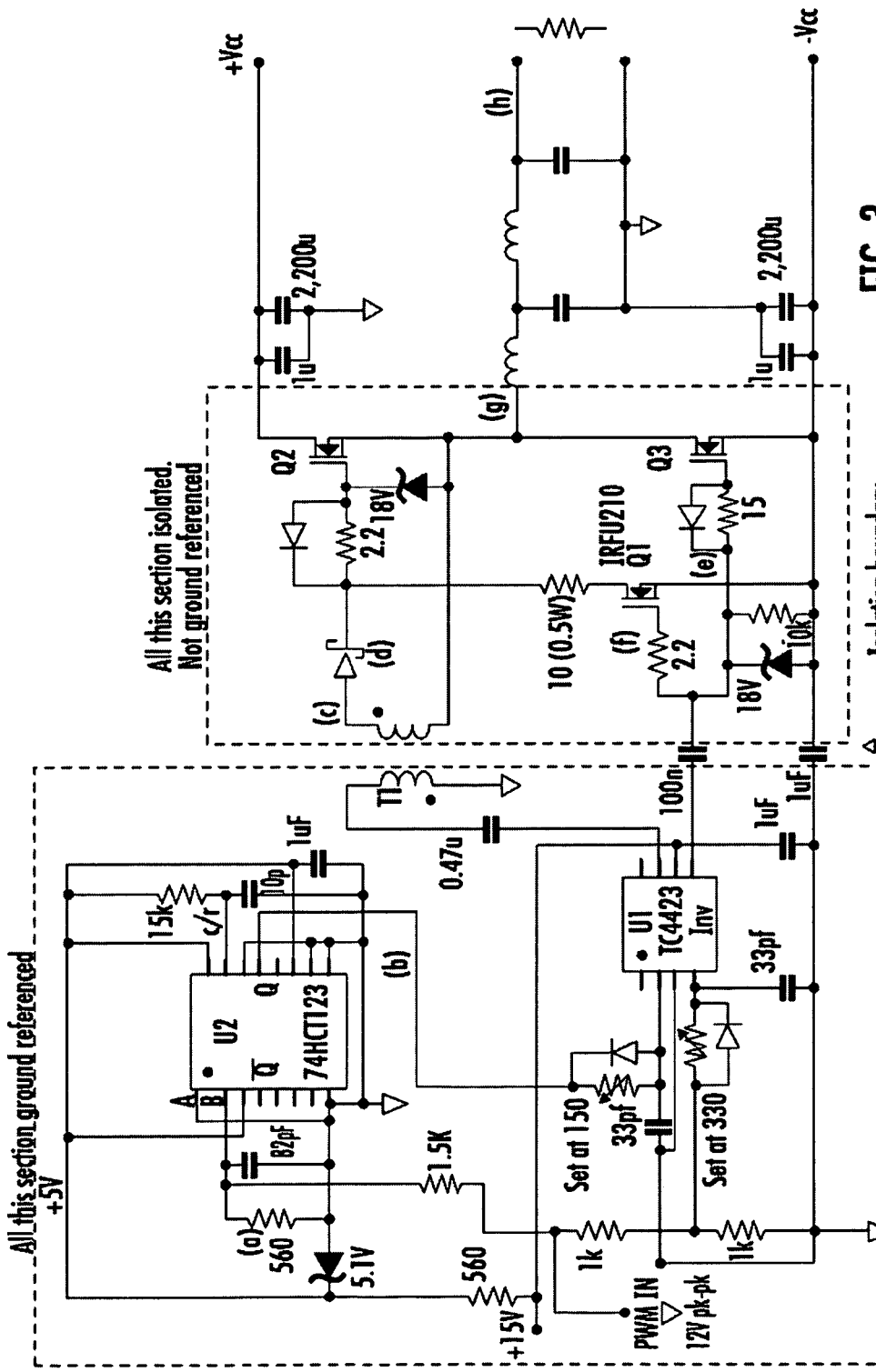

FIG. 3 is a variation on FIG. 2 and is a part of D2Audio's U.S. Pat. No. 7,078,963 and discussed therein, and incorporate herein by reference. In this solution, the drive does not rely on a saturating pulse transformer, but is obtained by a one shot pulse controlled by a DSP, which is applied to a small toroid that will not saturate. Timing errors due to variable saturation levels and/or temperature are therefore obviated. It is, however, slightly more complex in operation, and still has a small amplitude change over the duty cycle due to the charge on Ciss decaying slightly, just as in the topology given in FIG. 2.

Figure 4:
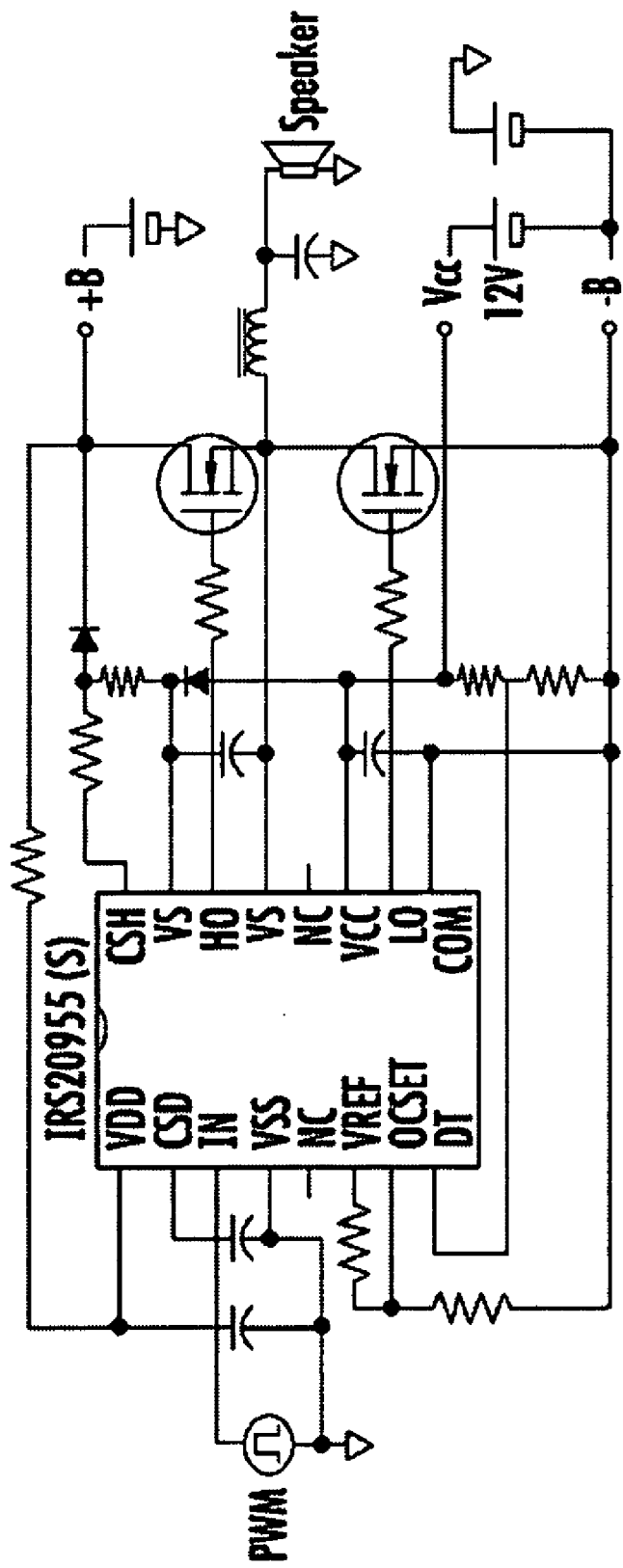

FIG. 4 shows a system that is widely used in all Nch applications. This solution uses a dedicated IC driver capable of driving both high and low output devices simultaneously, due to the internal level shifting built into the part. Typical examples are the IRS20124 or IRS20965S, available from Internal Rectifier Corporation, headquartered in El Segundo, Calif., USA. Also, several custom parts are available, such as the IRS20965S. The top drive in particular has a bootstrap arrangement that provides the necessary gate enhancement above the positive supply rail.

The one thing that these devices have in common is that, due to the internal level shifting, combined with high voltages needed (often up to +/−100 V), propagation delays are in the region of 60 ns to 90 ns from input to output. Propagation delays in themselves would not be too much of a problem if they were consistent and spread free. However, typical spreads on matching between top and bottom drive outputs are given as +/−7 ns to +/−10 ns. Such wide spreads will give poor THD+N in open loop circuits (those which have no feedback) and further, if the dead band approaches zero, catastrophic failure of the output devices can occur due to excessive shoot-through currents.

Figure 5:
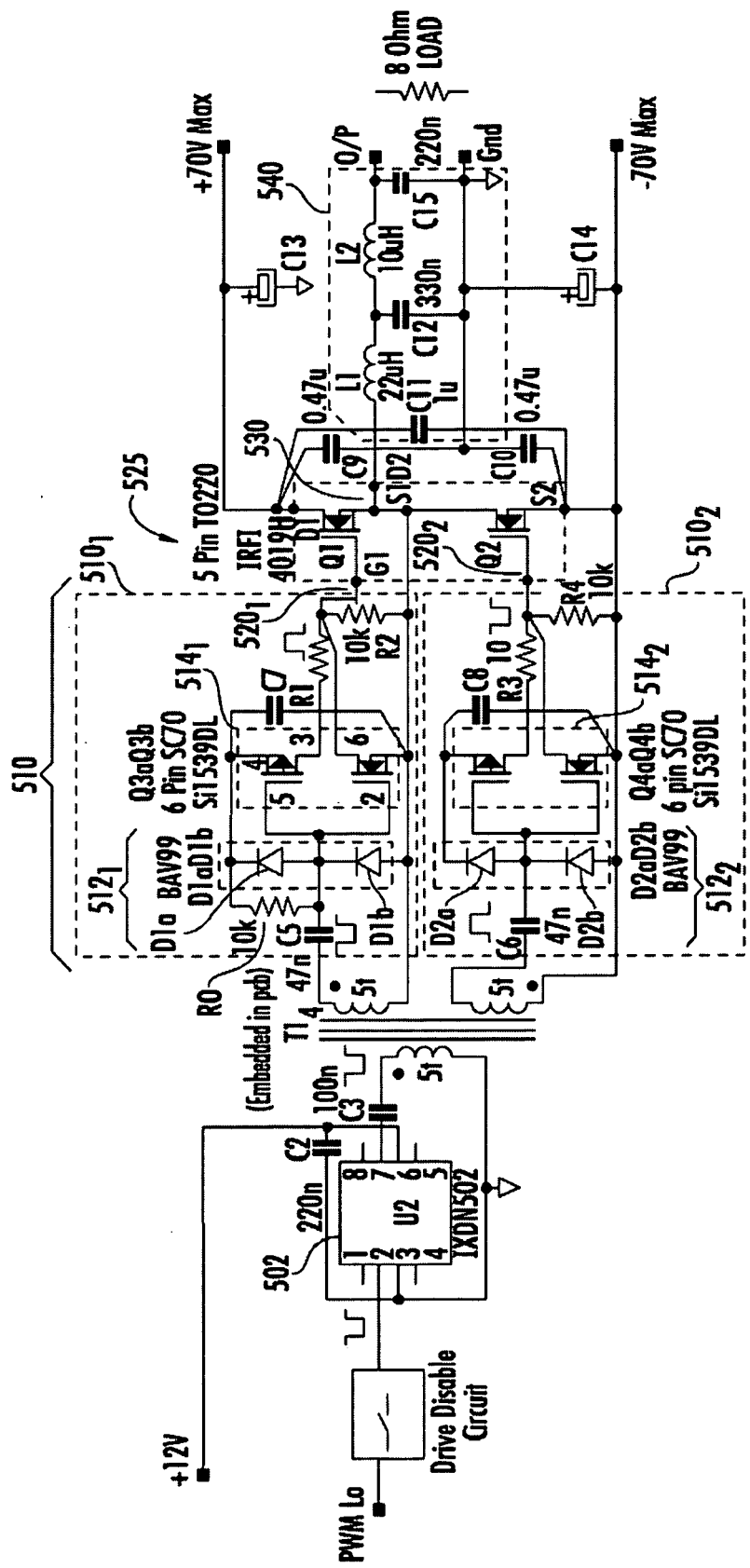
FIG. 5 is one of the simplest all Nch topologies according to one embodiment of the invention.

FIG. 5 shows a topology according to one embodiment of the present invention that allows very precise timing, with spreads on the gate drive timing between top and bottom devices being typically less than 1 ns. An extra resistor from C5 to the self-generated driver positive supply helps ensure that the upper output device Q1 is forced low to avoid or at least minimize turn-on and turn-off pops, plus allowing overload turn off conditions to be substantially noise free.

This circuit, plus the other circuits that follow all provide a substantially constant amplitude drive pulse over the full duty cycle, (typically <3% amplitude variation) irrespective of audio modulating frequencies over the range 20 Hz to over 20 kHz.

As mentioned above, there are a few transformer drive topologies for a floating MOSFET that have been proposed (see prior art FIGS. 2 and 3 by way of example), but these are mainly designed for use in switching power supply applications and the like. Some like FIGS. 2 and 3 can be adapted to audio applications, but do not meet the latest optimal stringent stability requirements that are desired. A further reference is given for a transformer drive in International Rectifier Application note AN937 ("AN937"), again with power supply applications in mind. In power supply applications, however, the criteria needed for successful operation are much simpler, since it is mainly the switching frequency involved with slowly varying modulation to compensate for line and load variations. By way of example, the circuit given in AN937 as shown will not work satisfactorily for high fidelity wide band audio applications.

To use such a system for audio applications, much more stringent criteria are needed due to the wide range of frequencies the transformer must pass, while preserving the total integrity of the drive signal. These frequencies range from an audio modulation component from 20 Hz up to 40 kHz, plus a basic switching frequency in the range from 200 kHz to 500 kHz. Any resonances or interaction caused by these frequencies will affect the integrity of the output pulse to the following driver stage, thus giving rise to non-linearity in the system and deterioration of THD performance.

The transformer (T1 in FIG. 5) therefore should be very carefully designed with the following parameters. The magnetizing inductance should be of such a value that substantially no resonances occur in any of the above frequency ranges, when coupled to the external driving capacitances both on the input and the output side of the transformer. Typically, this inductance would be about 35 μH for a switching frequency of 384 kHz.

Also included in this is the leakage inductance value, which can also give a problem with resonance. In addition, this leakage inductance should be as low as possible and very consistent in value between units. By way of explanation, any leakage inductance will effectively appear in series with the winding and will introduce a propagation delay, the value of which will depend on the associated external components and, as a result, actual spreads in propagation delay will contribute to timing mismatch (switching) errors between the output devices (Q1 and Q2 in FIG. 5), especially in those topologies that use separate drive paths for top and bottom drives.

For that reason, one preferred embodiment is a planar transformer with the windings embedded in the PCB (printed circuit board). This ensures that the transformer parameters are fixed and not subject to discrete winding variations.

Other parameters that have to be carefully considered are the onset of saturation of the core, which should be minimal. Even a few percent droop of inductance over the frequency range will produce a nonlinear component. Core losses also need be considered to minimize unwanted temperature rise. Typically, it is desirable to keep the temperature rise below 15° C.

By way of example only, a transformer with one primary winding and two secondaries meeting the above criteria is as follows.

| | |
|---|---|
| Windings: | Windings of 4 turns on each of 3 PCB layers, plus 1 layer for via interconnects. (Special interleaved winding techniques can be used to achieve maximum coupling and minimal leakage inductance.) |
| Inductance: | 35 μH typically Leakage Inductance < 1 μH |
| Core: | Ferroxcube Planar cores ER 14.5/3/7 |
| Material: | By way of example, but not limited to, Ferroxcube material grade 3F3 would be suitable. 1 Pair Ungapped |
| % L Droop | <3% over any modulation index. |

Input and output capacitances connected to the windings should be kept to a minimum to avoid resonances both in the audio bands and switching bands as discussed earlier.

Intrinsic magnetizing inductance and leakage inductance, plus all the external capacitances should be considered for any possible resonance within in the audio frequencies from 10 Hz to >20 kHz, and additionally at the switching frequency of the system.

The driver stage/stages following the transformer thus should have low input capacitance, they should switch very fast (typically 5 ns to 10 ns) and they should have very small propagation delays. These delays should be less than 6 ns and be very tightly defined so that any mismatch at the top and bottom MOSFET gates will be less than 1 ns.

In the topology shown in FIG. 5, the secondary windings drive both the high side and low side output MOSFETs Q1 and Q2, and since identical circuitry is employed after the transformer T1, the transformer action itself ensures that the output devices cannot cross conduct.

Using these techniques, actual timing spreads between top and bottom gate drive can be held to 1 ns or less, allowing the improved flexibility to improve THD+N safely without destructive shoot through currents occurring through top and bottom MOSFETs.

Figure 6:
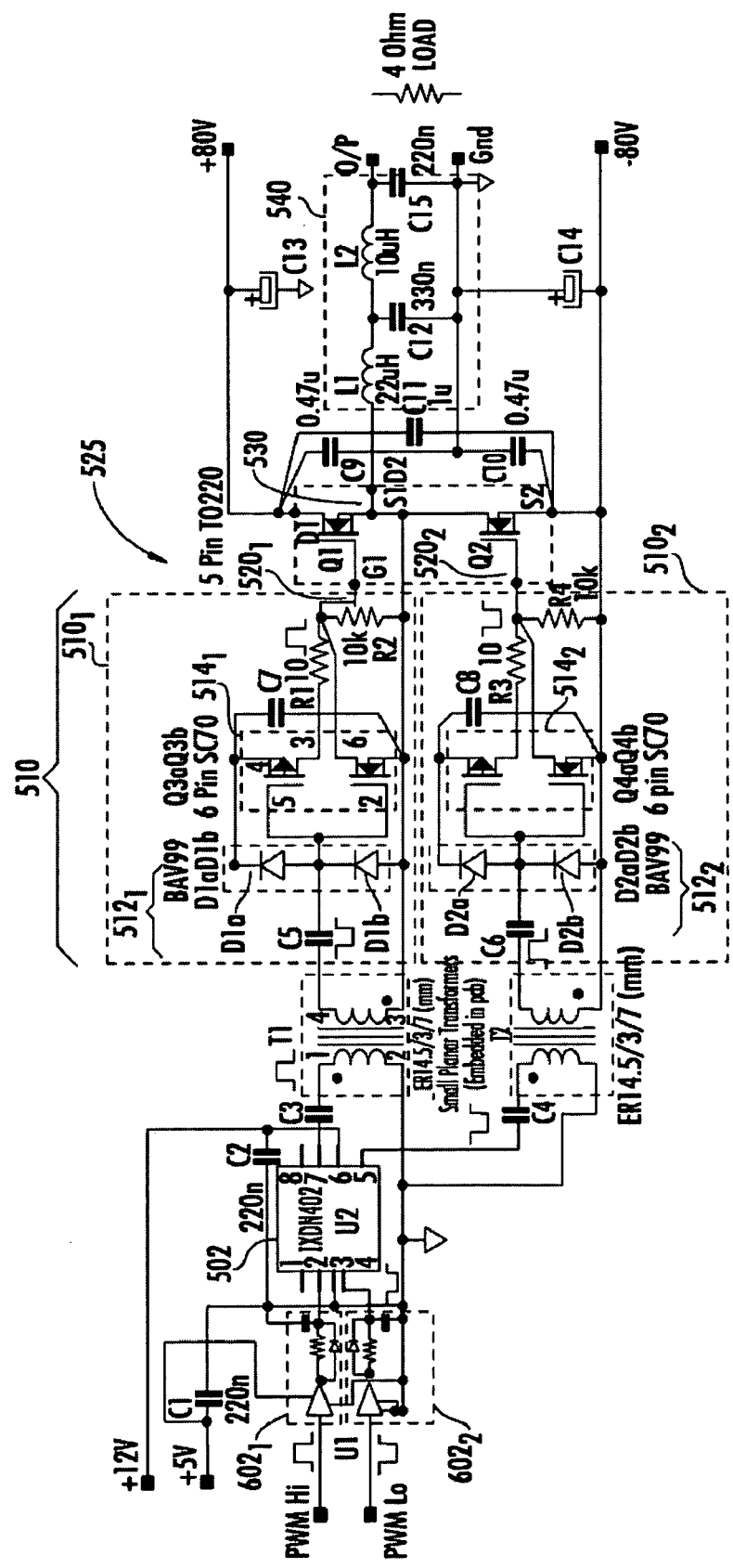
FIG. 6 is an alternative all Nch schematic according to an embodiment of the invention with two separate transformers.

FIG. 6 is similar to FIG. 5 in that it uses the same basic components, but with the flexibility to allow separate timing adjustments from a DSP to each individual gate. Such a drive system allows variable dead times according to the power level required. In this way, THD and quiescent currents can be changed dynamically to achieve the best performance over the power range from quiescent to full power. Furthermore, the DSP can control the turn-on and turn-off conditions such that both output MOSFETs Q1 and Q2 are turned off during these periods. In other words, by having separate PWM signals (shown as PWM Hi and PWM Lo in FIG. 6), both of the transistors Q1 and Q2 can be turned off at the same time, as opposed to in FIG. 5. Also shown in FIG. 6, prior to the input drivers 502, are timing compensation circuits $602_1$ and $602_2$, which can be used to adjust the relative timing of the PWM signals provided to the high side signal path and the low side signal path.

An example of dynamically changing dead times with power level would be the Dyna Timing control from D2Audio.

In accordance with an embodiment, two planar transformers are built into the PCB, which each transformer having a ferrite core.

As in the previous circuit of FIG. 5, spreads in timing, whatever dead band is being used, are very tightly controlled to levels typically of 1 ns.

Figure 7:
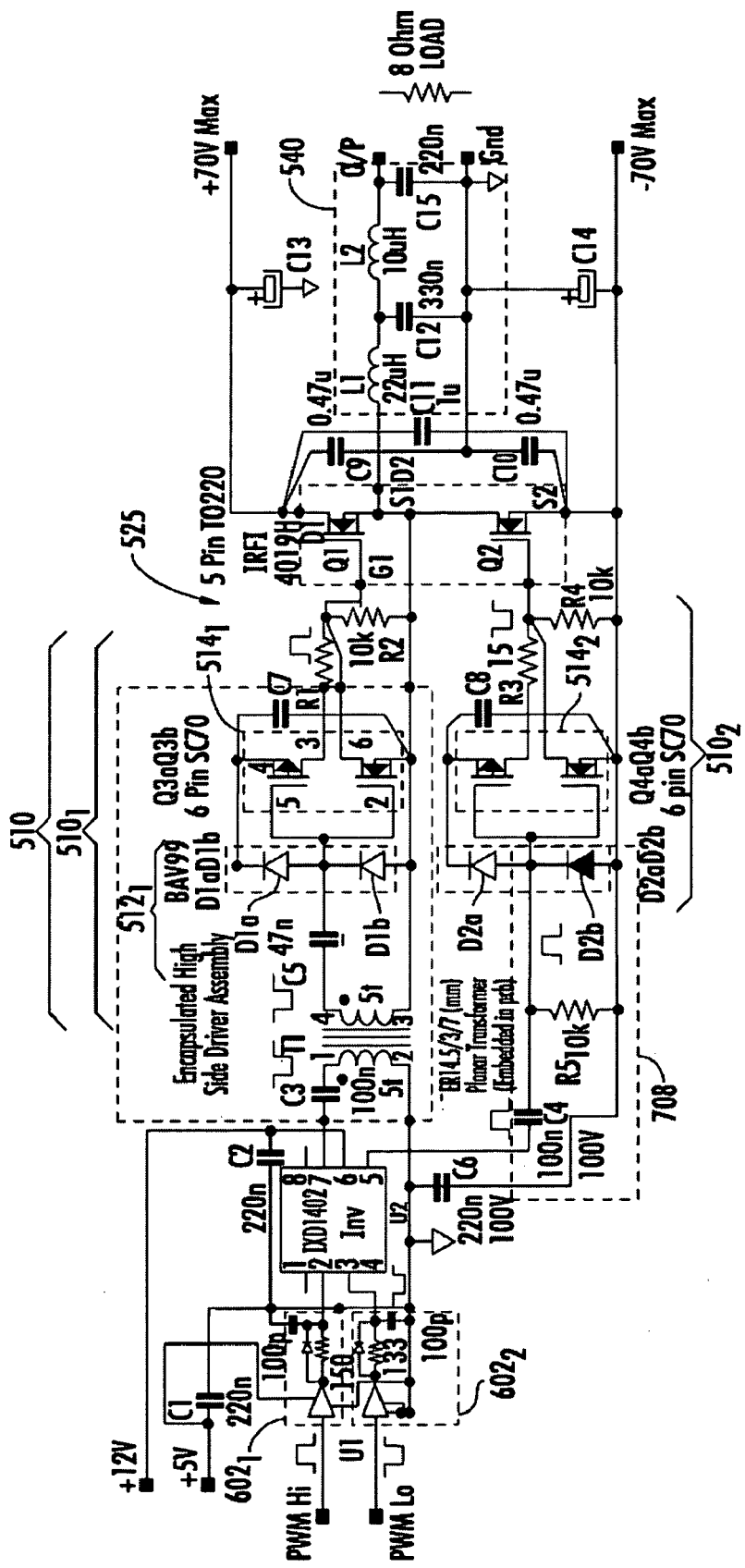
FIG. 7 is another all Nch schematic according to an embodiment of the invention with one transformer and separate level shifting for the lower Nch.

FIG. 7 shows a different embodiment of the invention which uses one transformer for the top drive, plus a capacitor coupled drive signal that is DC-restored and referenced to the negative rail for the bottom drive. In this topology, as in the previous case, independent control of upper and lower drive paths is feasible. But in accordance with this embodiment of the invention, the minimal spread free timing capability is still retained.

Since all devices in both top and bottom drive paths are identical after the top side transformer secondary, the only extra propagation delay factor on the top side will be due to the leakage inductance of the transformer. As this will be very precisely defined from unit to unit by the planar PCB winding, this added propagation delay can be compensated in the lower channel, either in the DSP or in circuitry prior to the driver.

The added components of two diodes, two capacitors and two resistors at the input to U2 driver allow very fine adjustment of timing to <<1 ns where needed. For instance, if the DSP control can only adjust in 3 ns or 4 ns increments, then this would be a desirable enhancement. This can, of course, be used in other examples discussed in this application.

Figure 8A:
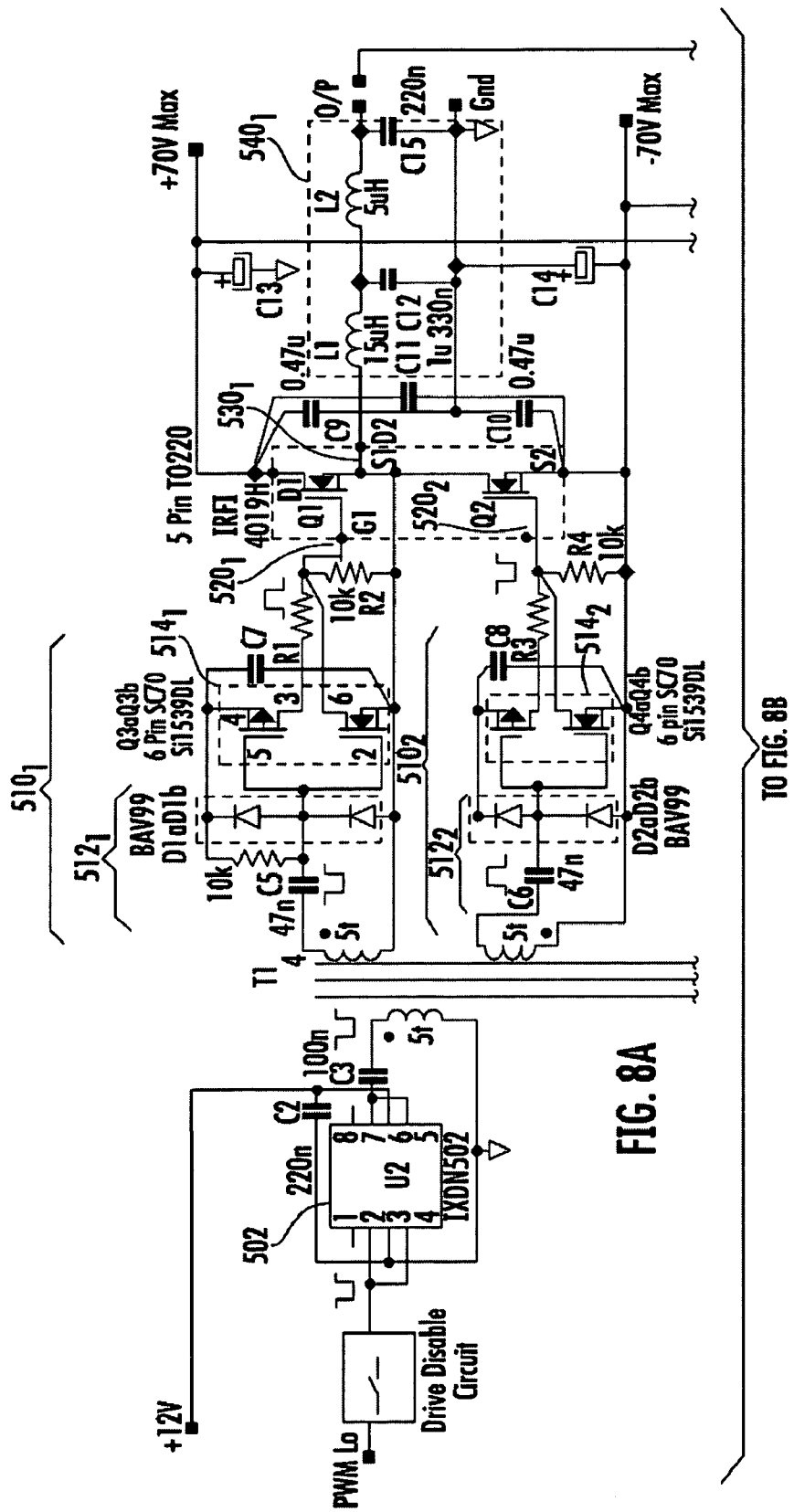
FIG. 8 is a simple all-Nch Bridge (BTL) schematic according to one embodiment of the invention.
Figure 8B:
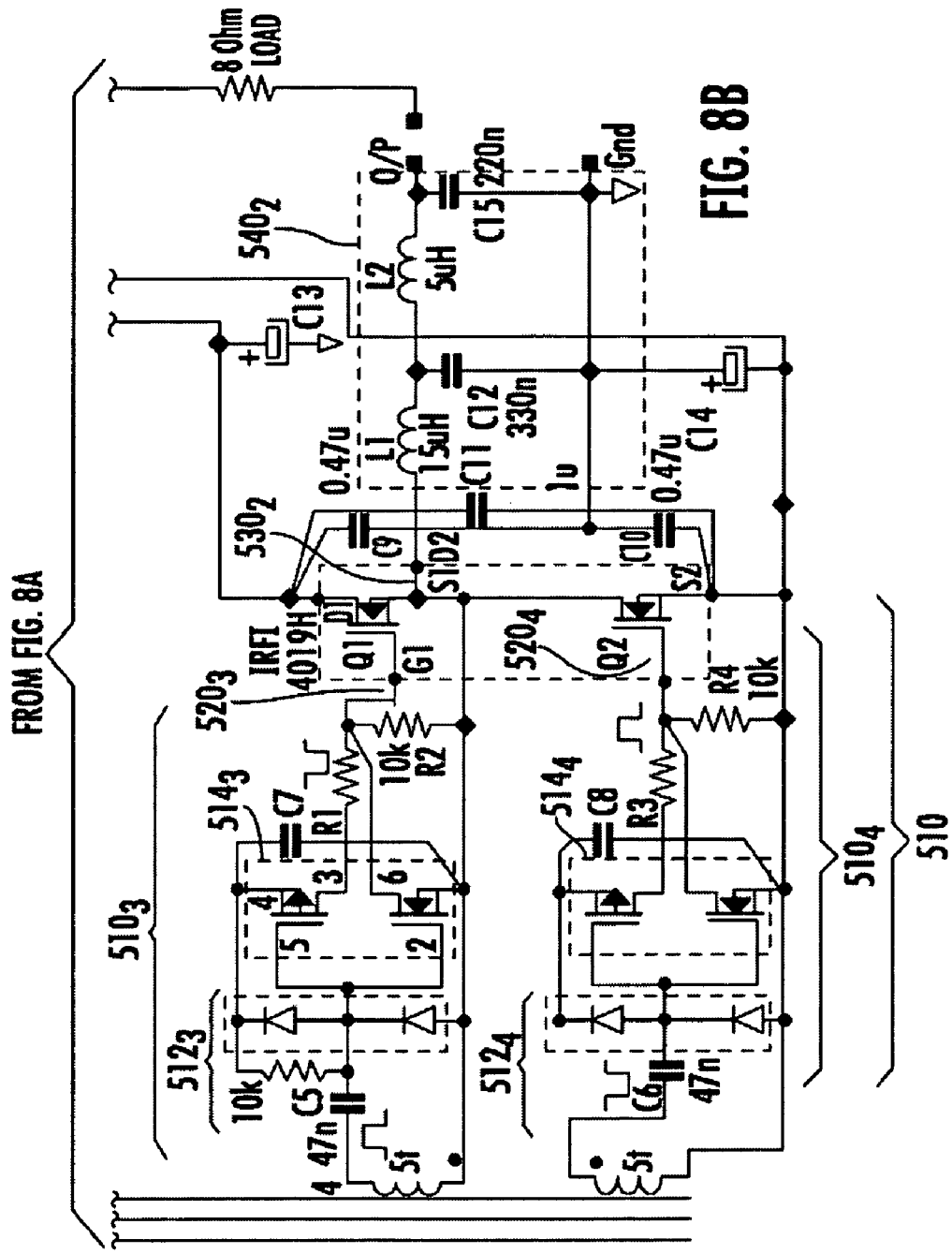

FIG. 8 is a bridged version of FIG. 5 and the same advantages apply, except that the power is doubled. Timing is still very precise on both channels.

Figure 9:
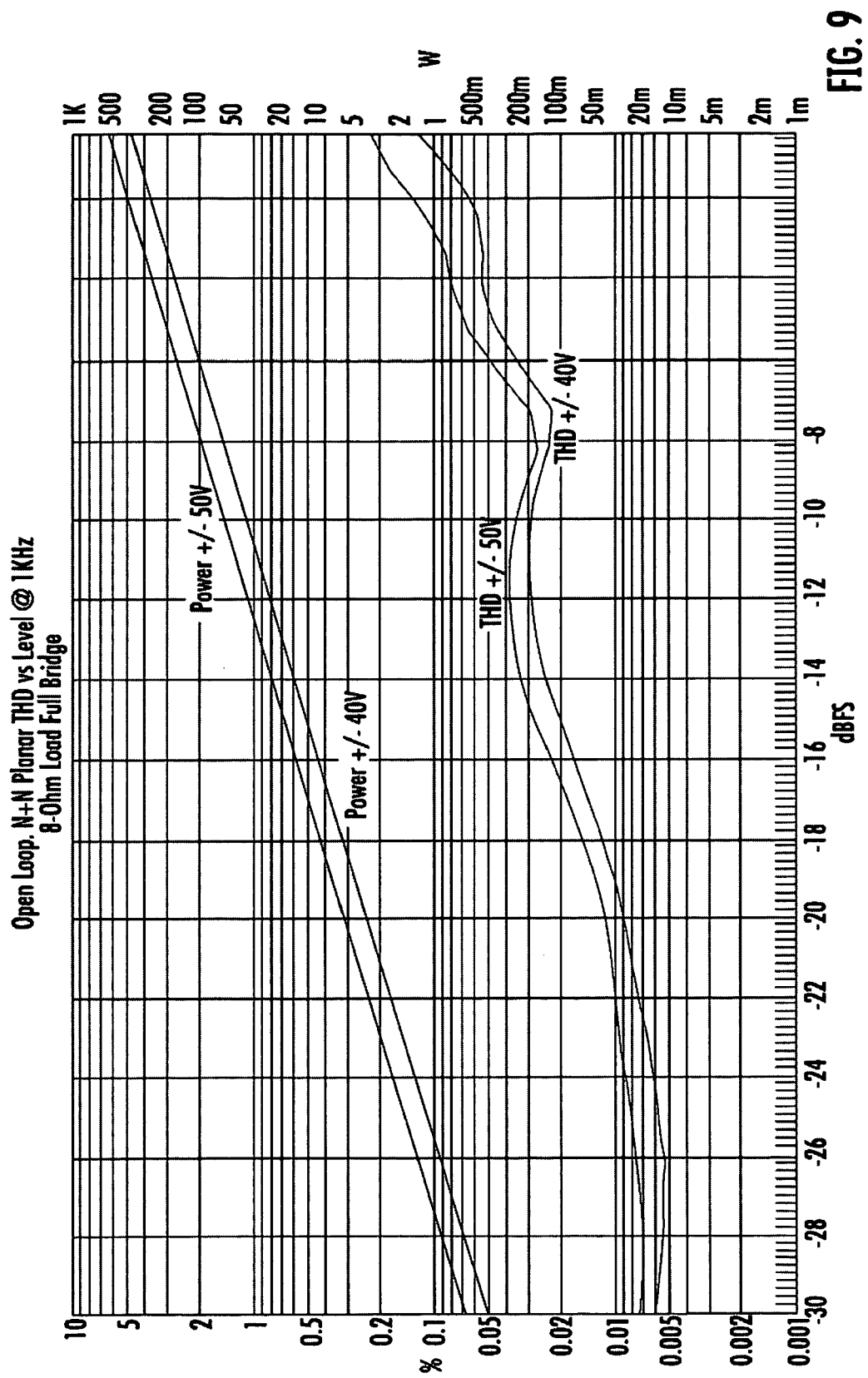
FIG. 9 is a plot of total harmonic distortion plus noise (THD+N) versus power for a circuit according to one embodiment of the invention.

FIG. 9 is a graph that shows results from the basic circuit of FIG. 7, but in bridge (also referred to as bridge tied load, or BTL) configuration, it can be seen that the THD level is very low indeed for an open loop system, and is only possible due to the very tight spreads on timing. Dead band timing was set at approximately 2 ns.

Under closed loop conditions, these THD+N results will be improved by the amount of negative feedback applied, which is typically 15 dB to 20 dB.

Figure 10:
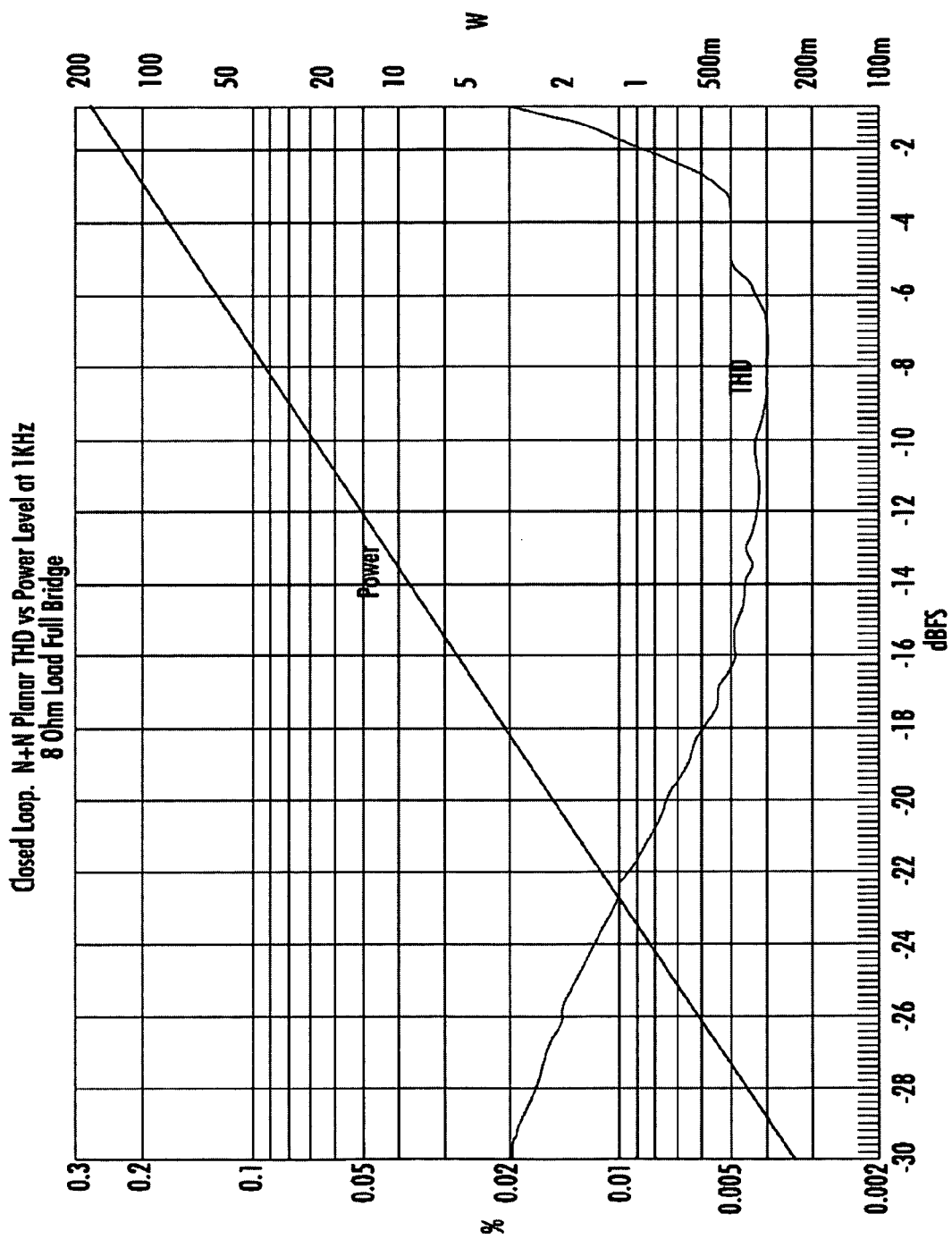
FIG. 10 is a plot of THD+N versus power with negative feedback applied.

FIG. 10 shows results using the basic topology as used for FIG. 7, but with negative feedback applied.

The invention may include many different embodiments. For instance, one embodiment is a switching amplifier driver and output stage including: a half bridge circuit with 2 power output switches configured to drive the load; a very fast (e.g., <8 ns rise/fall times), low propagation delay (e.g., <10 ns input-to-output) driver stage to drive each output device, the driver stage having minimal input capacitance (preferably <100 pF); and a transformer to drive any or all drive paths from the transformer inputs to the driver stage switches, with characteristics such that when coupled to all associated external circuitry avoids any or all resonances within the audio band of frequencies from <20 Hz to at least 40 KHz and also avoids all resonances at the amplifier switching frequencies. The transformer has low and spread free leakage inductance characteristics, whose value should again avoid any such resonances when coupled to the external circuitry. For example, the transformer may have <6 μH inductance, which remains relatively constant, having a spread limited to +/−20%. The transformer meets all foregoing criteria, but still has enough magnetizing inductance to keep transformer currents low in proportion to the total driver stage current drain. The transformer has low core losses (causing <15° C. rise) at the switching frequency and has minimal inductance change (typically <3%) over its minimum to maximum duty cycle range. The transformer is well below saturation point under any operating condition including temperature such that its inductance, especially the minimal leakage inductance, will not substantially change. For example, the drop in inductance may be limited to no more than 3%. The amplifier stage provides a substantially constant amplitude drive signal to the output power switching devices, over any modulated audio frequency range, typically from 20 Hz to 20 kHz and at any modulation index from 1% to 99%.

The transformer may be a planar transformer, whose windings are embedded in the PCB, to further ensure repeatability of the desired magnetizing and leakage inductances within very close tolerances.

The output power devices may, for example, be MOSFETs (Metal Oxide Semiconductor Field Effect Transistors) or IGBT (Insulated Gate Bipolar Transistor) type devices. The amplifier may be connected in bridge mode (BTL). The output semiconductor switching device may be in a single package using adjacent die for optimal matching of characteristics.

The switching amplifier may be configured to ensure that at initial turn-on or turn-off of the system, or under overload conditions, both output switches are turned off until the system is either reset or operating under stabilized conditions, thus avoiding audible turn-on/turn-off pops.

Suitable circuitry may be added, either directly in the output switch gate electrode path or in an appropriate connection point at the input of the power stage, to fine tune timing adjustments to better than 1 ns, in addition to any coarse DSP controlled timing adjustments.

A single primary and two secondaries in the switching amplifier may provide suitable drive signals to top and bottom half-bridge sections with minimal mismatch errors. A single primary and four secondaries may alternatively provide suitable drive signals for a bridge (BTL) configuration.

The lower drive path may be driven by a capacitor and the signal DC restored by diode and resistor means, and the following drive circuitry may be identical to the top section drive to achieve identical propagation delays after the transformer.

Additional details of the circuits of FIGS. 5-8 are described below. Referring to FIG. 5, a switching amplifier driver and output stage system is shown as including a transformer T1, a driver stage 510, and a half bridge power stage 525. The half bridge power stage 525 includes a high side N-channel switching transistor Q1 and a low side N-channel switching transistor Q2. Alternative switching amplifier driver and output stage systems are shown in FIGS. 6-8. In specific embodiments, these systems are digitally controlled Class-D switching audio amplifier systems.

In FIG. 5, the transformer T1 includes a primary and two secondaries, with the primary configured to receive a pulse width modulated (PWM) drive signal from an input driver 502. While the input driver(s) in FIGS. 5-8 is/are shown as being an IXDN502, available from IXYS Corporation (headquartered in Milpitas, Calif., USA), alternative input drivers can be used. In FIG. 6, two transformers T1 and T2 are used, each with a primary and secondary. In FIG. 7, a single transformer T1 is used for the high side signal path, and a level shifter 708 is used for the low side signal path. The level shifter 708 is shown as including capacitor C4, resistor R5 and diode D2b. Alternative level shifters may also be used. In FIG. 8, the transformer T1 includes a primary and four secondaries.

In the embodiment of FIG. 5, as well as the embodiments of FIGS. 6-8, the transformer(s) is/are preferably configured to prevent resonances within an audio band of frequencies from 20 Hz to 40 kHz and at a switching frequency of said high and low side N-channel switching transistors, as explained above. Additionally, the transformer(s) is/are preferably configured to have a free leakage inductance which is no more than 6 µH, a spread of no more than +/−20%, a magnetizing inductance of no less than 35 µH, and core losses at the switching frequency of no more than 15° C., as explained above.

The driver stage 510 is shown as including a first gate drive circuit 510$_1$ and a second gate drive circuit 510$_2$. In FIG. 5, the first gate drive circuit 510$_1$ is connected to one of the secondaries of transformer T1, and configured to output a high side drive signal 520$_1$, which is an amplified version of the PWM drive signal. The second gate drive circuit 510$_2$ is configured to output a low side drive signal 520$_2$. As explained above, the driver stage 510 is preferably configured to have a switching time of no more than 8 ns, a propagation delay of no more than 10 ns, and an input capacitance of no more than 100 pF. In accordance with an embodiment, at least the first gate drive circuit 510$_1$ is located on a PCB, and the transformer(s) is/are planar transformer(s) embedded in the PCB, as explained above. In the embodiments where there are more than one transformer, all of the transformers can be embedded in the same PCB, or they can each be embedded in a separate PCB. In alternative embodiments, the transformer(s) is/are discrete transformer(s).

The driver stage 510 should have a fast switching time, a low propagation delay, and a low input capacitance. More specifically, in accordance with an embodiment of the present invention, the driver stage 510 has a switching time of no more than 8 ns, a propagation delay of no more than 10 ns, and an input capacitance of no more than 100 pF, as explained above.

The high side N-channel switching transistor Q1 includes a gate driven by the high side drive signal 520$_1$, and a drain connected to a high voltage rail (e.g., +70V). The low side N-channel switching transistor Q2 includes a gate driven by the low side drive signal 520$_2$, a drain connected to a source of the high side N-channel switching transistor Q1, and a source connected to a low voltage rail (e.g., −70V). The switching transistors Q1 and Q2 can be MOSFETs or IGBTs, but are not limited thereto, as mentioned above. In accordance with an embodiment, the transistor Q1 and Q2 can be provided, e.g., using an IRFI4019H, available from International Rectifier, but is not limited thereto.

An output signal 530 is produced at the connected together source of the high side N-channel switching transistor Q1 and drain of the low side N-channel switching transistor Q2. In the embodiment of FIGS. 5-7, the output signal 530 is an amplified version of the PWM drive signal, with a voltage swing between the high voltage rail and ground. In the embodiment of FIG. 8, the output signal 530$_1$ and 530$_2$ are amplified versions of the PWM drive signal with a voltage swing between the high voltage rail and the low voltage rail. The output signal 530 is filtered by a low pass filter 540, before driving the load. While the low pass filter 540 is shown as being a fourth-order low pass filter, alternative filters can be used, e.g., a lower order or higher order filter may be used.

Referring to FIG. 5, the gate drive circuit 510$_1$ is shown as including a DC restoration circuit 512$_1$ and an amplifier circuit 514$_1$. The DC restoration circuit 512$_1$ is connected to one of the secondaries of the transformer. The amplifier circuit 514$_1$ includes a signal input terminal, a signal output terminal, a high supply terminal and a low supply terminal. In accordance with an embodiment, the high supply terminal and the low supply terminal of the amplifier circuit 514$_1$ receive power from said DC restoration circuit 512$_1$, as explained in more detail below. The signal input terminal of the amplifier circuit 514$_1$ receives a reconstructed and DC restored version of the PWM drive signal from the DC restoration circuit 512$_1$. The signal output terminal of the amplifier circuit 514$_1$ provides the high side drive signal 520$_1$ to the gate of the high side N-channel switching transistor Q1. In FIG. 5, the other gate drive circuit 510$_2$ includes a DC restoration circuit 512$_2$ and an amplifier circuit 514$_2$, with the DC restoration circuit 512$_2$ connected to the other one of the secondaries of the transformer. In FIG. 6 there are two separate transformers T1 and T2, and the DC restoration circuit 512$_2$ is connected to the secondary of the transformer T2.

Referring to FIG. 5, in accordance with an embodiment, the DC restoration circuit 512$_1$ is shown as including a capacitor C5 and a pair of diode D1a and D1b. One terminal of the capacitor C5 is connected to a terminal of the secondary, with the other terminal of the capacitor C5 connected to the anode of diode D1a and the cathode of diode D1b. Additionally, the anode of diode D1a and the cathode of diode D1b are connected to the signal input terminal of the amplifier circuit 514$_1$. The cathode of diode D1a is connected to the high supply terminal of the amplifier circuit 514$_1$. The anode of the diode D1b is connected to the low supply terminal of the amplifier circuit 514$_1$, and to the other terminal of the secondary. In this configuration, amplifier circuit 514$_1$ receives power from said DC restoration circuit 512$_1$. The DC restoration circuit 512$_1$ is also shown as including a resistor R0, which serves to damp the leakage inductance of the transformer, and further servers to assure a clean off condition if switching is stopped while a high voltage is still applied. While beneficial, the resistor R0 can be removed. The DC restoration circuit 512$_2$ and the amplifier circuit 514$_2$ are similar to the DC restoration circuit 512$_1$ and the amplifier circuit 514$_1$, and thus need not be described separately.

In accordance with an embodiment, the amplifier circuit 514$_1$ includes a complementary pair of transistors Q3a and Q3b, and the amplifier circuit 514$_2$ includes a further complementary pair of transistors Q4a and Q4b. In such embodiments, the sources of each complementary pair of transistors provide the high supply terminal and the low supply terminal of the amplifier circuit 514. In an embodiment, each complementary pair of transistors can be provided by an Si1549DL, available from Vishay, but is not limited thereto. In an embodiment, each above described complementary pair can be replaced with an IXDN502 (similar to the one used for the input stage(s) 502), which can function as the amplifier circuits 514, but with more propagation delay than is optimal.

Referring, e.g., to FIG. 5, capacitor C3 is a DC blocking capacitor, capacitor C4 is a power supply decoupling capacitor, and capacitors C7 and C8 are storage capacitors. Resistor R1, connected between the drains of the transistors Q3a and Q3b, provides charging current shaping for the high side drive signal 520$_1$. Resistor R3, connected between the drains of the transistors Q4a and Q4b, provides charging current shaping for the low side drive signal 520$_2$. When capacitors of the circuit need to discharge, resistors R2 and R4 provide for a guaranteed off position for transistors Q1 and Q2.

The benefits and advantages which may be provided by the present invention have been described above with regard to specific embodiments. These benefits and advantages may be found in some or all embodiments of the invention. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to that embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as described above.

What is claimed is:

1. A switching amplifier driver and output stage system comprising:
   a half bridge power stage having two power output switches configured to drive a load;
   a driver stage configured to drive the power output switches, wherein the driver stage has a fast switching time, a low propagation delay, and a low input capacitance; and
   a transformer configured to drive the driver stage,
      wherein the transformer is configured to prevent resonances within an audio band of frequencies from 20 Hz to 40 kHz and at a switching frequency of the power output switches,
      wherein the transformer has a low free leakage inductance,
      wherein the transformer is configured to prevent resonance within the audio band and at a switching frequency of the power output switches when coupled to external circuitry,
      wherein the transformer has sufficient magnetizing inductance to keep transformer currents low in proportion to the total driver stage current drain,
      wherein the transformer has low core losses at the switching frequency, and
      wherein the transformer is configured to remain below a characteristic saturation point under all operating conditions.

2. The switching amplifier driver and output stage system of claim 1, wherein:
   the driver stage has a switching time of no more than 8 ns;
   the driver stage has a propagation delay of no more than 10 ns;
   the driver stage has an input capacitance of no more than 100 pF;
   the transformer has free leakage inductance which is no more than 6 μH;
   the transformer has spread of no more than +/−20%;
   the transformer has magnetizing inductance of no less than 35 μH;
   the transformer has core losses at the switching frequency of no more than 15° C.; and
   the driver stage provides a substantially constant amplitude drive signal to the power output switches over the audio band and at any modulation index from 1% to 99%.

3. The switching amplifier driver and output stage system of claim 1, wherein the transformer comprises a planar transformer whose windings are embedded in a printed circuit board (PCB).

4. The switching amplifier driver and output stage system of claim 1, wherein the power output switches comprise transistors selected from the group consisting of:
   Metal Oxide Semiconductor Field Effect Transistors (MOSFETs); and
   Insulated Gate Bipolar Transistors (IGBTs).

5. The switching amplifier driver and output stage system of claim 1, further comprising a further driver stage and a further half bridge power stage having two further power output switches which collectively with the driver stage and the half bride power stage are configured in a bridge mode.

6. The switching amplifier driver and output stage system of claim 1, wherein the system is configured to, at initial turn-on and at turn-off of the system and under overload conditions, turn off both power output switches until the system is either reset or operating under stabilized conditions and thereby avoid audible pops.

7. The switching amplifier driver and output stage system of claim 1, further comprising circuitry located either directly in the output semiconductor gate electrode path or at the input of the power stage and configured to adjust timing signals provided to the power stage.

8. The switching amplifier driver and output stage system of claim 1, wherein the transformer has a single primary winding and two secondary windings configured to provide drive signals to top and bottom half-bridge sections of the power stage.

9. The switching amplifier driver and output stage system of claim 1, wherein the transformer has a single primary winding and four secondary windings configured to provide drive signals for a bridge (BTL) configuration of the power stage.

10. The switching amplifier driver and output stage system of claim 1, wherein the switching frequency of the power output switches is in the range from about 200 kHz to about 500 kHz.

11. A switching amplifier driver and output stage system comprising:
   a power stage including a high side N-channel switching transistor (Q1) and a low side N-channel switching transistor (Q2);
   a transformer including a primary and a secondary, said primary configured to receive a pulse width modulated (PWM) drive signal from an input driver (502);
   said transformer configured to prevent resonances within an audio band of frequencies from 20 Hz to 40 kHz and at a switching frequency of said high and low side N-channel switching transistors;
   a driver stage including a first gate drive circuit ($510_1$) and a second gate drive circuit ($510_2$);
   said first gate drive circuit ($510_1$), connected to said secondary, and configured to output a high side drive signal ($520_1$), which is an amplified version of the PWM drive signal;
   said second gate drive circuit ($510_2$), configured to output a low side drive signal ($520_2$);
   said high side N-channel switching transistor (Q1) including a gate, a drain and a source, said gate driven by the high side drive signal ($520_1$), and said drain connected to a high voltage rail; and
   said low side N-channel switching transistor (Q2) including a gate, a drain and a source, said gate driven by the low side drive signal ($520_1$), said drain connected to said source of said high side N-channel switching transistor (Q1), and said source connected to a low voltage rail;
   wherein an output signal (530) is produced at the connected together said source of said high side N-channel switching transistor (Q1) and said drain of said low side N-channel switching transistor (Q2).

12. The switching amplifier driver and output stage system of claim 11, wherein the output signal (530) comprise an amplified version of the PWM drive signal with a voltage swing between the high voltage rail and either the low voltage rail or ground.

13. The switching amplifier driver and output stage system of claim 11, wherein:

said driver stage is configured to have
a switching time of no more than 8 ns,
a propagation delay of no more than 10 ns, and
an input capacitance of no more than 100 pF; and
said transformer is configured to have
a free leakage inductance which is no more than 6 μH,
a spread of no more than +/−20%,
a magnetizing inductance of no less than 35 μH, and
core losses at the switching frequency of no more than 15° C.

14. The switching amplifier driver and output stage system of claim 11, wherein said first gate drive circuit ($510_1$) comprises:
a DC restoration circuit ($512_1$) connected to said secondary;
an amplifier circuit ($514_1$) including a signal input terminal, a signal output terminal, a high supply terminal and a low supply terminal;
wherein said high supply terminal and said low supply terminal of said amplifier circuit ($514_1$) receive power from said DC restoration circuit;
wherein said signal input terminal of said amplifier circuit ($514_1$) receives a reconstructed and DC restored version of the PWM drive signal from said DC restoration circuit ($512_1$); and
wherein said signal output terminal of said amplifier circuit ($514_1$) provides said high side drive signal ($520_1$) to said gate of said high side N-channel switching transistor (Q1).

15. The switching amplifier driver and output stage system of claim 14, wherein said DC restoration circuit ($512_1$) of said first gate drive circuit ($510_1$) comprises:
a capacitor (C5) having a first terminal and a second terminal, said first terminal of said capacitor (C5) connected to a first terminal of said secondary;
a first diode (D1a) having an anode and a cathode, said anode of said first diode (D1a) connected to said second terminal of said capacitor (C5) and to said signal input terminal of said amplifier ($514_1$), and said cathode of said first diode (D1a) connected to said high supply terminal of said amplifier ($514_1$); and
a second diode (D1b) having an anode and a cathode, said anode of said second diode (D1b) connected to a second terminal of said secondary and to said low supply terminal of said amplifier ($514_1$), and said cathode of said second diode (D1b) connected to said anode of said first diode (D1a) and to said signal input terminal of said amplifier ($514_1$).

16. The switching amplifier driver and output stage system of claim 11, further comprising a low pass filter (540) configured to filter the output signal (530).

17. The switching amplifier driver and output stage system of claim 11, further comprising:
a printed circuit board (PCB) on which at least said first gate drive circuit is located;
wherein said transformer comprises a planar transformer embedded in said PCB.

18. The switching amplifier driver and output stage system of claim 11, wherein:
said transformer includes a second secondary;
said second gate drive circuit ($510_2$) is connected to said second secondary; and
said low side drive signal ($520_2$) is an inverted and amplified version of the second PWM drive signal.

19. The switching amplifier driver and output stage system of claim 11, further comprising:
a second transformer comprising a primary and a secondary, said primary configured to receive a second pulse width modulated (PWM) drive signal from a second input driver (502), and said secondary connected to said second gate drive circuit ($510_2$);
wherein said low side drive signal ($520_2$) is an amplified version of the second PWM drive signal.

20. The switching amplifier driver and drive output stage system of claim 11, further comprising:
a level shifting circuit (708) configured to receive a second pulse width modulated (PWM) drive signal from a second input driver (502), and to provide a level shifted version of the second PWM drive signal to said second gate driver circuit ($510_2$);
wherein said low side drive signal ($520_2$) is an amplified and level shifted version of the second PWM drive signal.

21. The switching amplifier driver and output stage system of claim 11, the switching frequency of said high and low side N-channel switching transistors is in the range from about 200 kHz to about 500 kHz.

22. A method for driving a power stage including a high side N-channel switching transistor (Q1) and a low side N-channel switching transistor (Q2), the method comprising:
driving a primary of a transformer with a pulse width modulated (PWM) drive signal;
reconstructing the PWM drive signal, restoring a DC level of the PWM drive signal, and generating a voltage potential to power an amplifier, at a secondary of the transformer;
using the powered amplifier to amplify the reconstructed and DC restored PWM drive signal, to thereby produce an amplified PWM drive signal;
driving the high side N-channel switching transistor (Q1) with the amplified PWM drive signal;
reconstructing, restoring a DC level, and/or level shifting a further PWM drive signal;
using a further amplifier to amplify the reconstructed, DC restored and/or level shifted further PWM drive signal to thereby produce a further amplified PWM drive signal; and
driving the low side N-channel switching transistor (Q2) with the further amplified PWM drive signal;
wherein the steps of driving the high side N-channel switching transistor (Q1) with the amplified PWM drive signal, and driving the low side N-channel switching transistor (Q2) with the further amplified PWM drive signal, are performed such that the high side N-channel switching transistor and the low side N-channel switching transistor are not turned on at the same time, thereby avoiding shoot through currents due to cross conduction between the high side N-channel switching transistor (Q1) and the low side N-channel switching transistor (Q2).

23. The method of claim 22, wherein the steps of claim 21 are performed to prevent resonances within an audio band of frequencies from 20 Hz to 40 kHz and at a switching frequency of said high and low side N-channel switching transistors.

24. The method of claim 22, wherein the steps of driving the high side N-channel switching transistor (Q1) with the amplified PWM drive signal, and the driving the low side N-channel switching transistor (Q2) with the further amplified PWM drive signal, are performed such that the switching dead times between the high side N-channel switching transistor and the low side N-channel switching transistor are kept to about 2 ns or less.

25. A switching amplifier driver and output stage system comprising:

a half bridge power stage having two power output switches configured to drive a load;

a driver stage configured to drive the power output switches; and a transformer configured to drive the driver stage, wherein the transformer is configured to prevent resonances within an audio band of frequencies from 20 Hz to 40 kHz and at a switching frequency of the power output switches.

26. The switching amplifier driver and output stage system of claim 25, wherein the switching frequency of the power output switches is in the range from about 200 kHz to about 500 kHz.

* * * * *

UNITED STATES PATENT AND TRADEMARK OFFICE
CERTIFICATE OF CORRECTION

PATENT NO. : 7,816,985 B2  Page 1 of 1
APPLICATION NO. : 12/270692
DATED : October 19, 2010
INVENTOR(S) : Attwood et al.

It is certified that error appears in the above-identified patent and that said Letters Patent is hereby corrected as shown below:

In Claim 5, at Column 14, line 2, please change "bride" to --bridge--.

Signed and Sealed this

Fourteenth Day of December, 2010

David J. Kappos
*Director of the United States Patent and Trademark Office*